(12) United States Patent
Mistry et al.

(10) Patent No.: US 7,215,044 B2
(45) Date of Patent: May 8, 2007

(54) POWER DISTRIBUTION BOARD HAVING CONNECTORS WITH AC AND DC POWER DISTRIBUTION CAPABILITIES

(75) Inventors: Pradeep Mistry, Austin, TX (US); Suraj DeSilva, Austin, TX (US); Ralph W. Jensen, Austin, TX (US); Bassam Marawi, Austin, TX (US); Lynn Simmons, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 430 days.

(21) Appl. No.: 10/621,220

(22) Filed: Jul. 16, 2003

(65) Prior Publication Data

US 2005/0012402 A1     Jan. 20, 2005

(51) Int. Cl.
*H01B 7/30* (2006.01)
(52) U.S. Cl. .................. 307/147; 439/218; 361/600
(58) Field of Classification Search ................ 307/147; 439/679, 680, 218, 222; 361/600, 788, 777
See application file for complete search history.

(56) References Cited

U.S. PATENT DOCUMENTS

| | | | |
|---|---|---|---|
| 4,683,583 A * | 7/1987 | Kossor ................ 379/200 |
| 5,397,929 A * | 3/1995 | Hogarth et al. ............ 307/140 |
| 5,612,854 A | 3/1997 | Wiscombe et al. ......... 361/727 |
| 5,777,396 A * | 7/1998 | Kikuchi ................. 307/112 |
| 5,835,350 A * | 11/1998 | Stevens ................ 361/704 |
| 6,172,891 B1 | 1/2001 | O'Neal et al. ............. 363/146 |
| 6,639,972 B1 * | 10/2003 | Cannon et al. .......... 379/88.18 |
| 6,819,761 B1 * | 11/2004 | Williams ............... 379/399.01 |
| 2002/0044642 A1 * | 4/2002 | Danner et al. ......... 379/355.01 |
| 2002/0137382 A1 * | 9/2002 | Shirakura et al. ........... 439/218 |
| 2003/0072144 A1 * | 4/2003 | Malkowski et al. ........ 361/826 |

* cited by examiner

*Primary Examiner*—Chau N. Nguyen
*Assistant Examiner*—Daniel Cavallari
(74) *Attorney, Agent, or Firm*—Baker Botts L.L.P.

(57) ABSTRACT

A single power distribution board having pin coded connectors may be used for both AC and DC power distribution to appropriate AC and/or DC power supplies in an information handling system. A common conductive layer may be used for either AC neutral or DC power supply return so as to eliminate one conductive layer in the power distribution board. Alternatively, total isolation of AC and DC power source inputs allow both AC and DC power supplies to operate together in a robust, redundant fashion. The DC power supplies in combination with a battery system may be used as an inexpensive uninterruptable power supply for the information handling system. Various DC and/or AC source voltages and frequencies may be coupled to appropriate power supplies through the pin coded connectors.

7 Claims, 7 Drawing Sheets

POWER DISTRIBUTION BOARD HAVING CONNECTORS WITH AC AND DC POWER DISTRIBUTION CAPABILITIES

BACKGROUND OF THE INVENTION TECHNOLOGY

1. Field of the Invention

The present invention is related to information handling systems, and more specifically, to distribution of power sources to power supplies of the information handling system.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems, e.g., computer, personal computer workstation, portable computer, computer server, print server, network router, network hub, network switch, storage area network disk array, RAID disk system and telecommunications switch.

Mission critical information handling systems such as computer servers and associated storage disk arrays require high availability and rapid replacement of defective modules, e.g., power supply. With high availability in mind, these information handling systems are being designed with modular power supplies that may be plugged into a power distribution board (PDB). The modular power supplies may be powered from either a direct current (DC) source or an alternating current (AC) source. However, different input power supplies and a different PDB must be used for connecting the power supplies to either the DC or AC source. Since the power supplies are modular plug-in units, switching from AC to DC input source power is not a major problem, however, having to change the PDB for the desired input source voltage is both impractical and expensive. A typical information handling system power supply is illustrated in commonly owned U.S. Pat. No. 5,612,854, entitled "Computer Power Supply Apparatus" by Wiscombe, et al., and is hereby incorporated by reference herein.

Therefore, a problem exists, and a solution is required to eliminate having to install one of two different PDBs when either a DC or an AC input power source is used.

SUMMARY OF THE INVENTION

The present invention remedies the shortcomings of the prior art by providing a single PDB having pin coded connectors that are compatible with and may be coupled to either an AC or a DC modular plug-in power supply, and can distribute the input power source, either AC or DC to the appropriate power supply. A plurality of power supplies may also be accommodated in a like fashion.

In an exemplary embodiment of the present invention, a PDB has pin coded power connectors adapted to mate with similar pin coded power connectors of the modular AC or DC power supplies. In the PDB pin coded power connectors, at least one pin of the AC power input to the modular AC power supply is different from at least one pin for the DC power input to the modular DC power supply. If an incorrect power input modular power supply is plugged into the PDB, nothing happens because at least one of the power supply input pins remains unconnected to the power source, e.g., the DC power supply will not be coupled to the AC power source, nor will the AC power supply be coupled to the DC power source. All other safety grounding and output pins remain the same and are compatible between the two different modular power supplies. Thus, a common PDB and pin coded power connector may be utilized for either AC or DC modular power supplies. This feature greatly increases the installation flexibility of the information handling system and reduces costs by eliminating two different types of PDBs. Since a single common PDB may be used for both AC and DC power applications, lower cost through greater quantity purchasing is achieved. Also, lower costs in manufacturing and inventory are achieved by only having to build one type of information handling system for either an AC or DC power source input.

In another exemplary embodiment of the present invention, a PDB is adapted to receive both AC and DC power input modular power supplies, and power both simultaneously. In this embodiment, the current carrying pins of the pin coded power input connector on the PDB are different for the AC and DC power source inputs. The PDB of this embodiment is adapted for connection to either or both AC and DC power sources. The modular plug-in power supplies, AC and/or DC, may be coupled together such that the power supply outputs to the information handling system modules may be load-shared between a plurality of power supplies. By load sharing between the power supplies a high degree of redundancy and thus reliability may be achieved. By using both AC and DC power supplies together, an uninterruptable power system may be economically created from the DC input power supplies in combination with the DC power source (e.g., 48 volt DC battery). An easily switchable power source (between AC or DC without rewiring or PDB changes) information handling system may also be easily implemented using this embodiment.

In yet another exemplary embodiment of the present invention, different voltage AC or DC power sources may be accommodated with a single PDB. Generally, 120 volts AC phase to neutral is used in the United States, however, other countries throughout the world may use different power source AC voltages. In addition, depending on the available power wiring, AC power source voltages of 208, 240 or 277 volts AC may be economically available (additional step down transformers not required). Preferably, the information handling system may be connected to an AC power source via a hot phase conductor and a neutral conductor, e.g., 120 or 277 volts, single phase AC. In aircraft and aboard ships, different power source voltages and frequencies may be available (both AC and DC may be available). The modular plug-in power supplies may be adapted to conform to a desired voltage by simply plugging the power supply into the PDB and the correct input connection is automatically selected through proper pin coded connectors of the multi-voltage PDB. Some modular power supplies may be of the switching type that rectify an AC input voltage before regulating the output voltage with a switching transistor(s). The switching power supplies operate over a wider range of input voltages, but would still benefit from the present invention. Depending upon the information handling system application and importance, various power sources may easily be used or easily changed in the field.

In the exemplary embodiments of the present invention, openings or cutouts in the PDB placed between the power connections (pins) of the PDB may be used to meet safety and/or code requirements for voltage isolation between the power connections of the PDB.

A technical advantage of the present invention is that one PDB may be used for distributing either an AC or DC power source through pin coded connectors to appropriate modular plug-in power supplies. Another technical advantage is a common PDB may be used with both AC and DC power supplies simultaneously being powered from respectively coupled AC and DC power sources. Another technical advantage is an uninterrupted power system comprising load sharing DC power supplies coupled to a DC battery power source. Still another technical advantage is inexpensive, reliable and foolproof coupling of a power source to an appropriate power supply. Another technical advantage is PDB openings between different voltage potential power connections allows the PDB to meet safety requirements for voltage isolation between the power connections. Other technical advantages should be apparent to one of ordinary skill in the art in view of what has been disclosed herein.

BRIEF DESCRIPTION OF THE DRAWINGS

A more complete understanding of the present disclosure and advantages thereof may be acquired by referring to the following description taken in conjunction with the accompanying drawings wherein.

Figure 1:
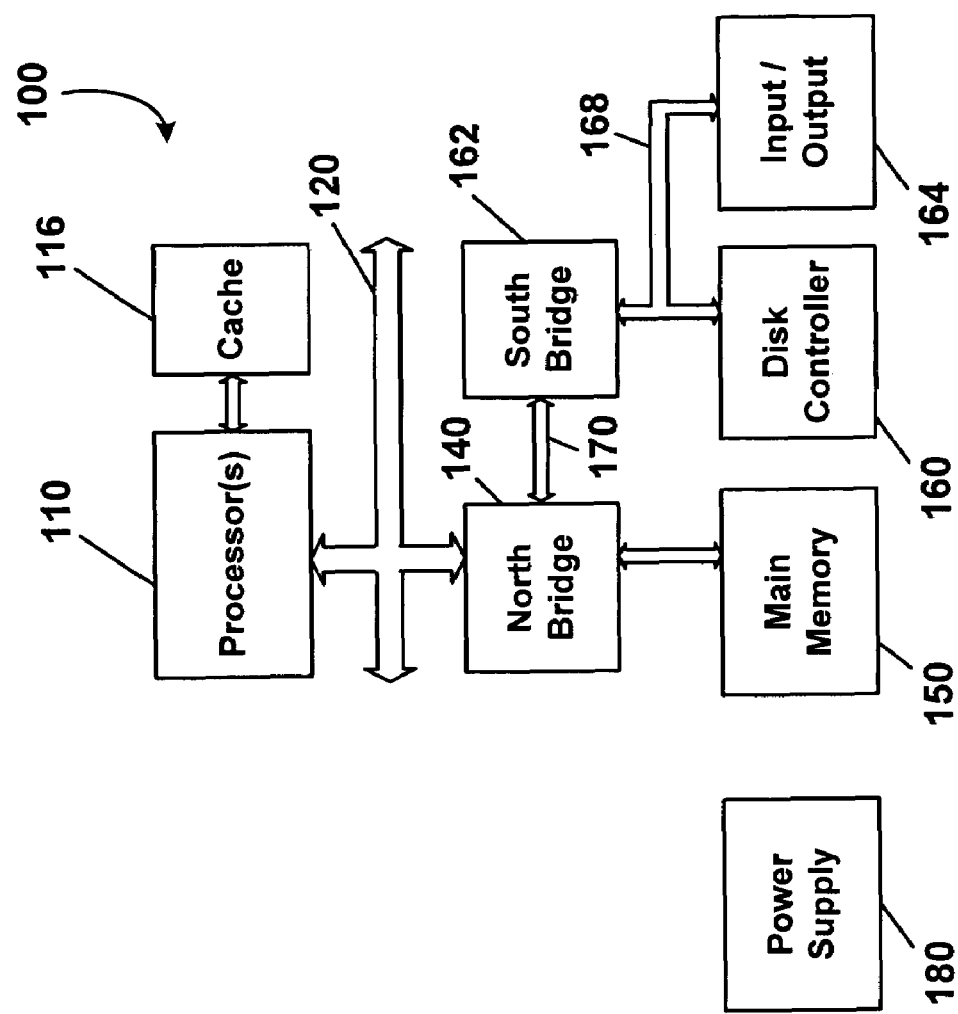
FIG. 1 is a schematic block diagram of an exemplary embodiment of an information handling system.

The present invention may be susceptible to various modifications and alternative forms. Specific exemplary embodiments thereof are shown by way of example in the drawing and are described herein in detail. It should be understood, however, that the description set forth herein of specific embodiments is not intended to limit the present invention to the particular forms disclosed. Rather, all modifications, alternatives, and equivalents falling within the spirit and scope of the invention as defined by the appended claims are intended to be covered.

DETAILED DESCRIPTION OF SPECIFIC EMBODIMENTS

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU), hardware or software control logic, read only memory (ROM), and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring now to the drawings, the details of an exemplary embodiments of the present invention are schematically illustrated. Like elements in the drawings will be represented by like numbers, and similar elements will be represented by like numbers with a different lower case letter suffix.

Referring to FIG. 1, an information handling system is illustrated having electronic components mounted on at least one printed circuit board (PCB) (motherboard) and communicating data and control signals therebetween over signal buses. In one embodiment, the information handling system is a computer system. The information handling system, generally referenced by the numeral 100, comprises a processor(s) 110 coupled to a host bus(es) 120 and a cache memory 116. A north bridge(s) 140, which may also be referred to as a memory controller hub or a memory controller, is coupled to a main system memory 150. The north bridge 140 is coupled to the system processor(s) 110 via the host bus(es) 120. The north bridge 140 is generally considered an application specific chip set that provides connectivity to various buses, and integrates other system functions such as a memory interface. For example, an Intel 820E and/or 815E chip set, available from the Intel Corporation of Santa Clara, Calif., provides at least a portion of the north bridge 140. The chip set may also be packaged as an application specific integrated circuit (ASIC). The north bridge 140 typically includes functionality to couple the main system memory 150 to other devices within the information handling system 100. Thus, memory controller functions such as main memory control functions typically reside in the north bridge 140. In addition, the north bridge 140 provides bus control to handle transfers between the host bus 120 and a second bus(es), e.g., PCI bus 170, AGP bus coupled to graphics display (not shown), etc. A second bus(es) 168 may also comprise other industry standard buses or proprietary buses, e.g., ISA, SCSI, USB buses through a south bridge(s) (bus interface) 162. These secondary buses 168 may have their own interfaces and controllers, e.g., ATA disk controller 160 and input/output interface(s) 164.

Figure 5:
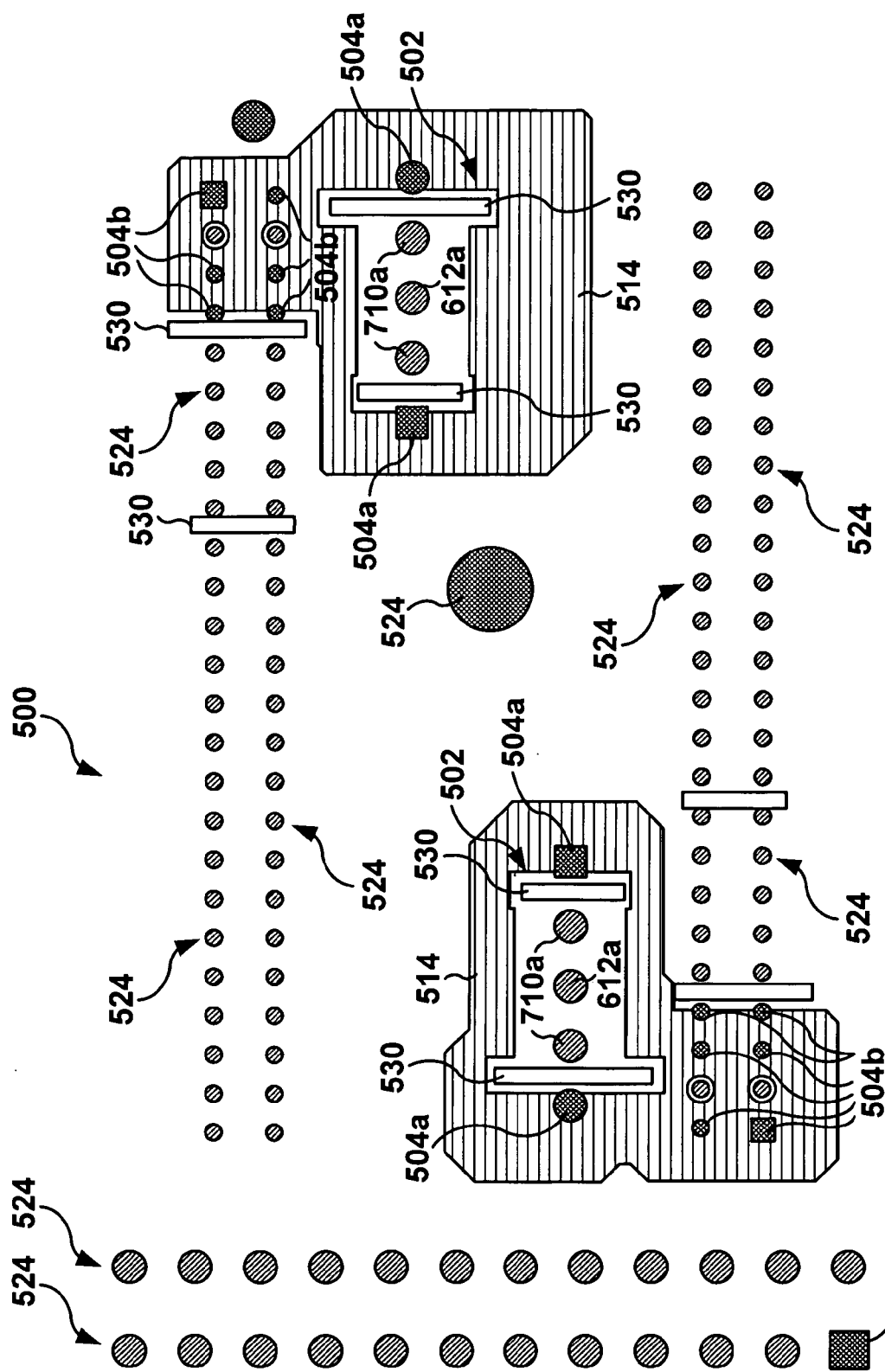
FIG. 5 is a plan view of a common or ground conductive layer of an exemplary power distribution board (PDB) according to the present invention.
Figure 6:
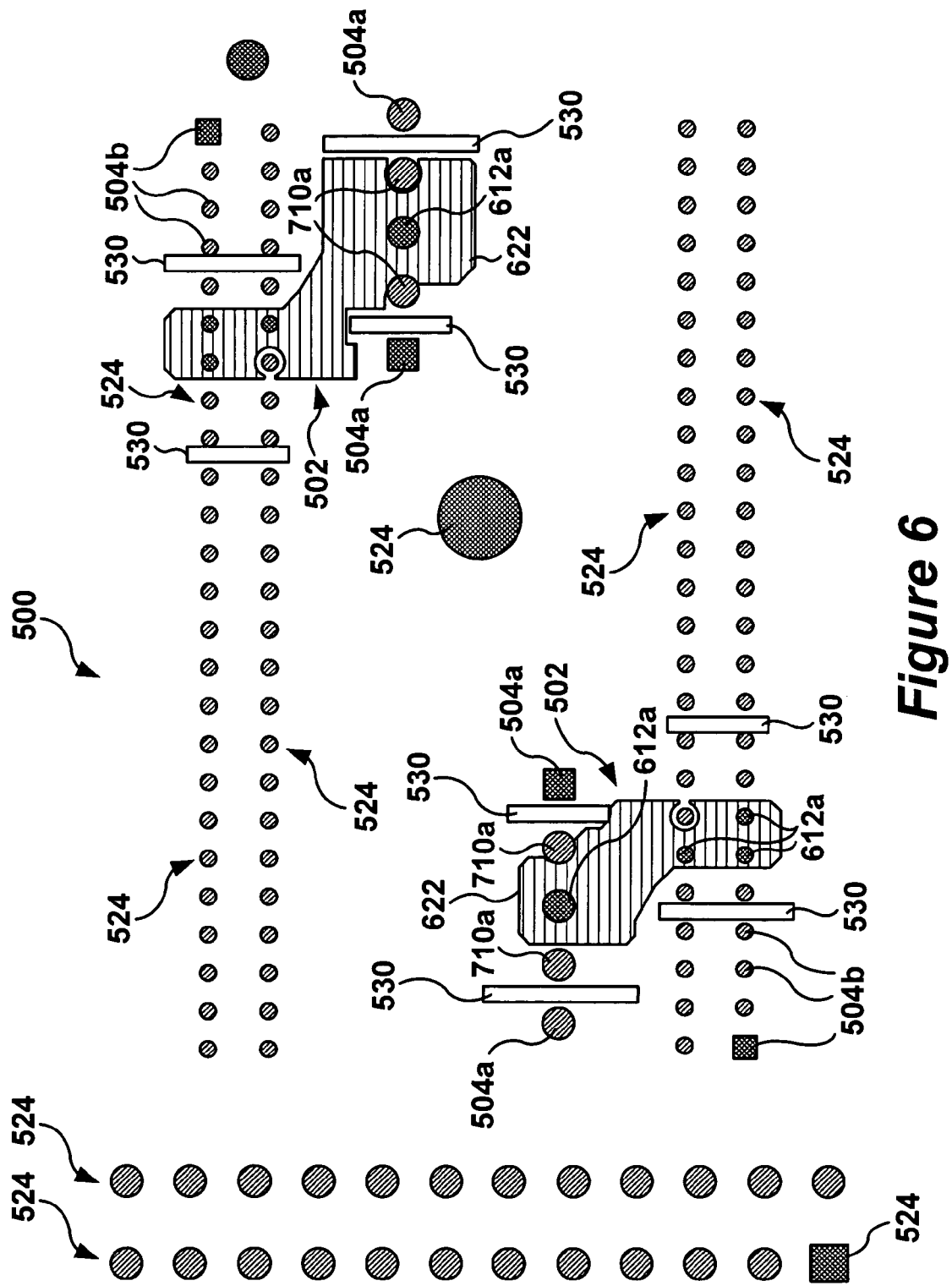
FIG. 6 is a plan view of an alternating current (AC) conductive layer of the exemplary PDB of FIG. 5.
Figure 7:
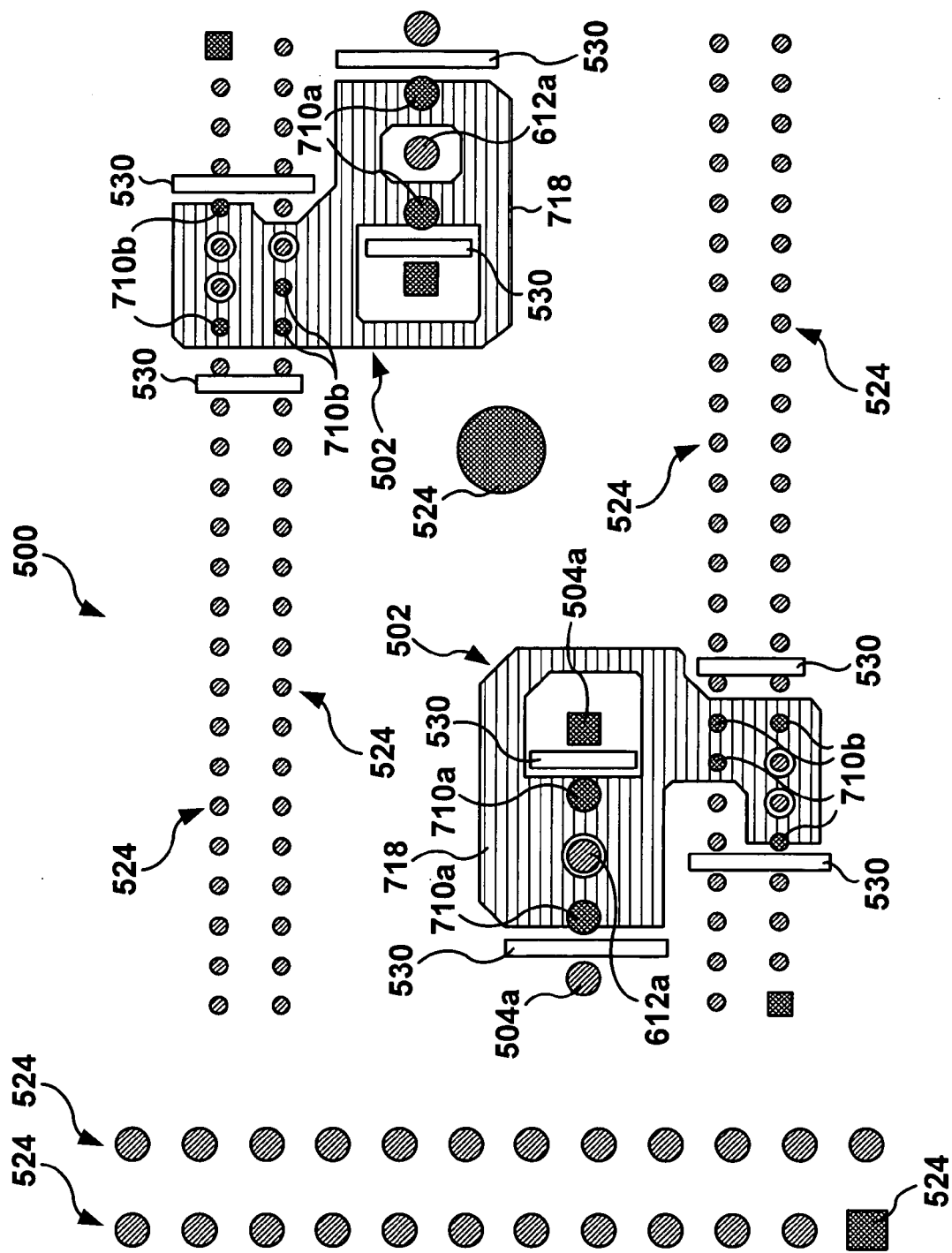
FIG. 7 is a plan view of a direct current (DC) conductive layer of the exemplary PDB of FIG. 5.

In the information handling system 100, according to the present invention, at least one modular power supply 180 is coupled to electronic components comprising the aforementioned subsystems through a power distribution board (PDB) (see FIGS. 5, 6 and 7).

Figure 2:
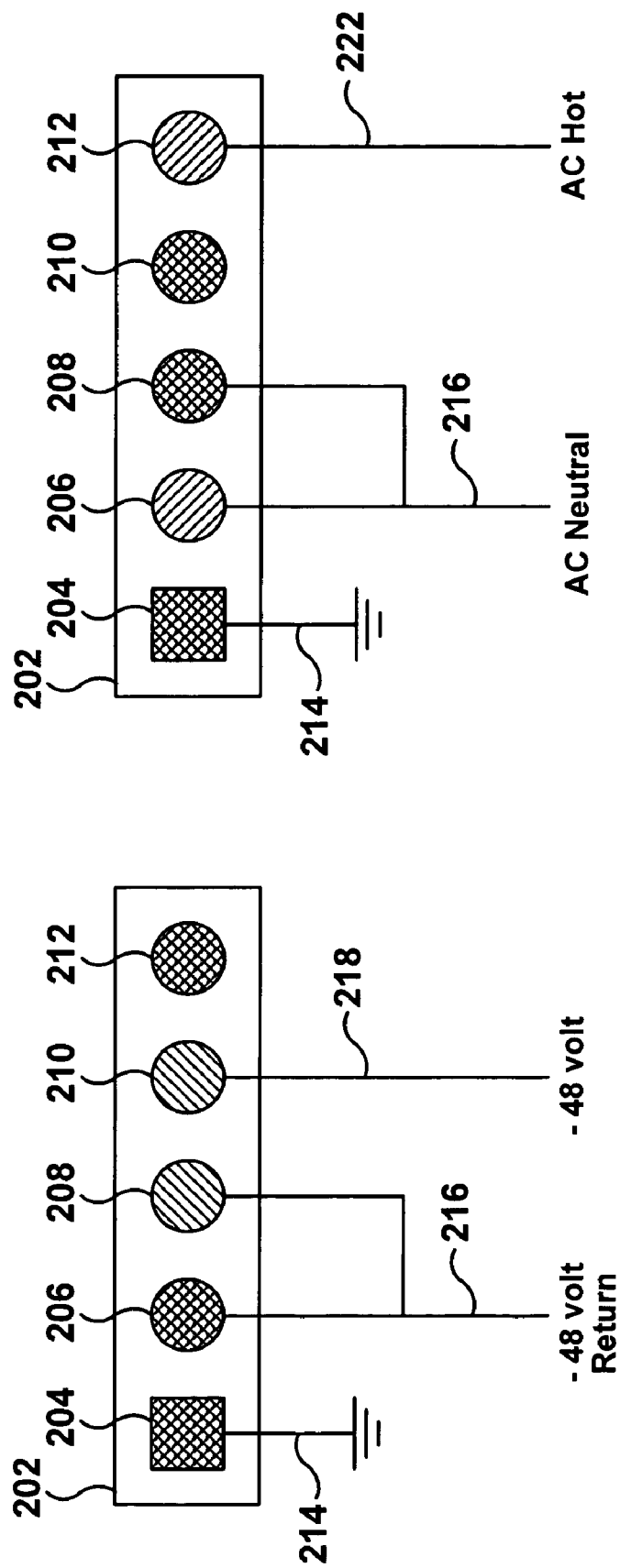
FIG. 2 is a schematic block diagram of an exemplary embodiment of the present invention.

Referring to FIG. 2, depicted is an exemplary embodiment of modular power supply pin coded connectors 202 on a power distribution board (PDB), according to the present invention. Each of the pin coded connectors 202 mates with a modular power supply 180 and may comprise a ground pin 204, an AC neutral pin 206, a DC return pin 208, a DC power pin 210 and an AC hot pin 212. An AC input modular power supply 180 may receive power at pins 206 and 212, and a DC input modular power supply 180 may receive power at pins 208 and 210. The PDB is a multi-layer printed circuit board (see FIGS. 5, 6 and 7) having the following conductive layers: Ground layer 214 is connected to pin 204, DC power layer 218 is connected to pin 210, and AC hot layer 222 is connected to pin 212. An advantage of connecting pins 206 and 208 to a common layer 216 (used for either DC power return or AC neutral) is that one conductive layer in the PDB may be eliminated.

Figure 3:
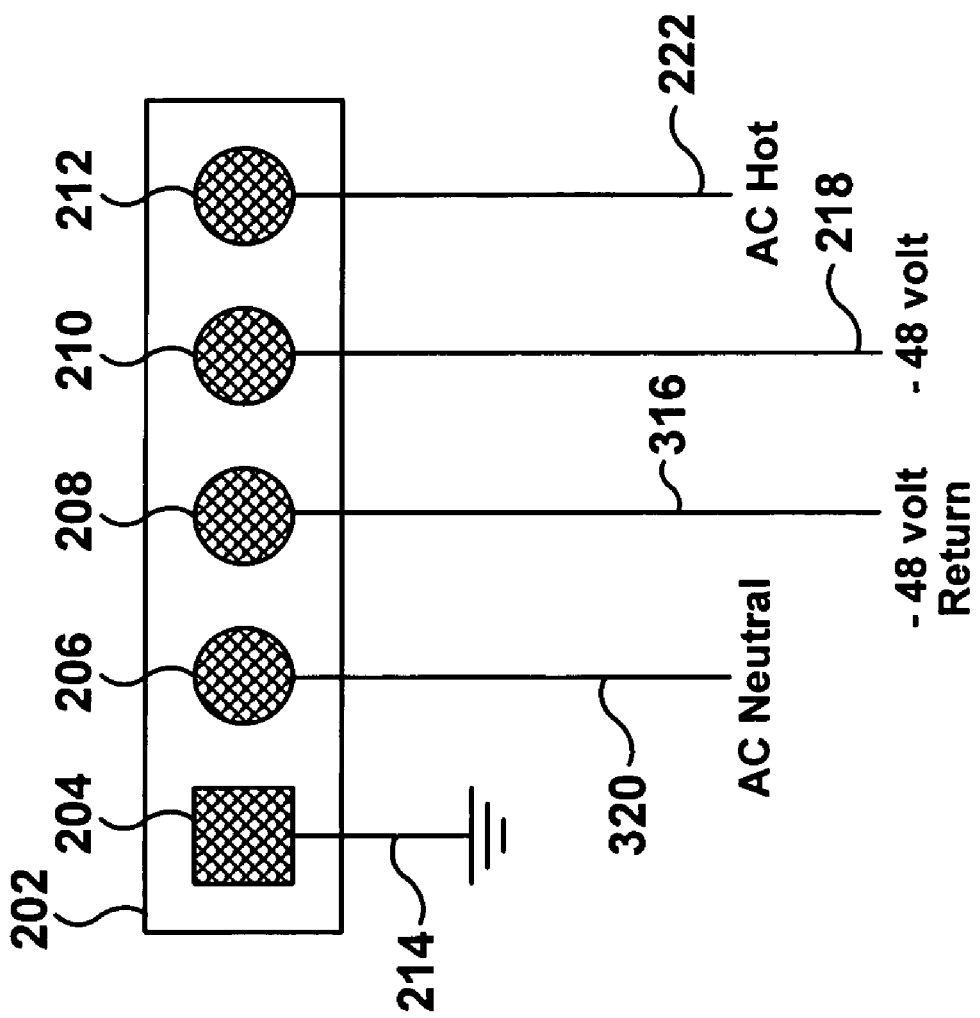
FIG. 3 is a schematic block diagram of another exemplary embodiment of the present invention.

Referring to FIG. 3, depicted is another exemplary embodiment of the modular power supply pin coded connector 202 on a power distribution board (PDB), according to the present invention. The pin coded connector 202 mates with the modular power supply 180 and may comprise a ground pin 204, an AC neutral pin 206, a DC return pin 208, a DC power pin 210 and an AC hot pin 212. The AC input modular power supply 180 will receive power at pins 206 and 212, and a DC input modular power supply 180 will receive power at pins 208 and 210. The PDB is a multi-layer printed circuit having the following conductive layers: Ground layer 214 is connected to pin 204, AC neutral layer 320 is connected to pin 206, DC return layer 316 is connected to pin 208, DC power layer 218 is connected to pin 210, and AC hot layer 222 is connected to pin 212. An advantage of connecting pins 206 and 208 to different layers 320 and 316, respectively, is that both AC and DC modular power supplies may operate simultaneously in the information handling system, so long as both AC and DC sources are available. Another advantage of this embodiment is if there is enough spare capacity in the DC power supplies of the information handling system to remain functional, then the DC power supplies in combination with the DC power source may be used as an inexpensive uninterruptable power supply.

Figure 4:
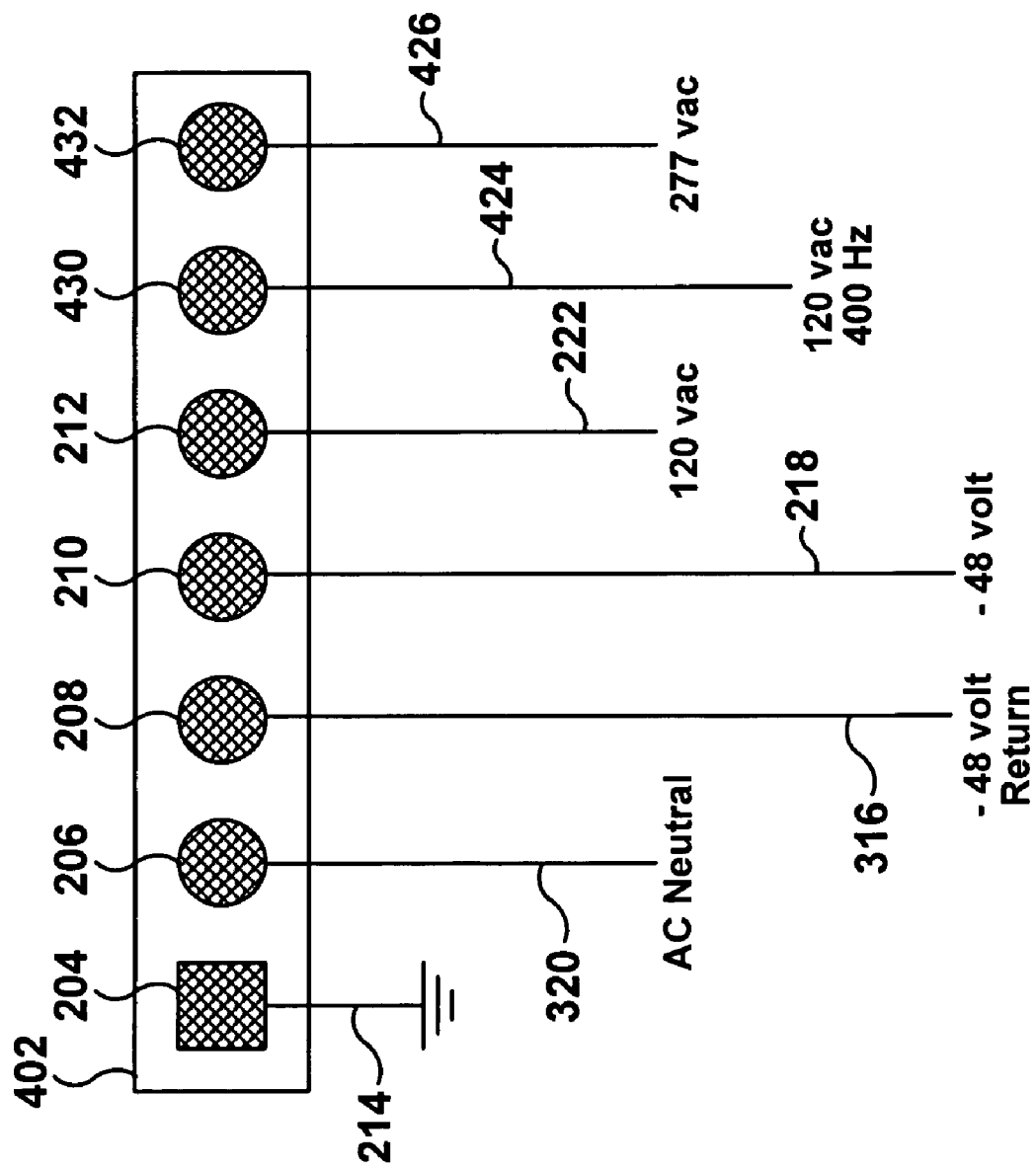
FIG. 4 is a schematic block diagram of still another exemplary embodiment of the present invention.

Referring to FIG. 4, depicted is another exemplary embodiment of the modular power supply pin coded connector 402 on a power distribution board (PDB), according to the present invention. The pin coded connector 402 mates with the modular power supply 180 and may comprise a ground pin 204, an AC neutral pin 206, a DC return pin 208, a DC power pin 210, a first AC hot pin 212, a second AC hot pin 430, and a third AC hot pin 432. More or less pins may be used depending upon the application. The AC input modular power supply 180 may receive power at pins 206 and 212, 206 and 430 or 206 and 432, depending upon what AC power source is connected to the PDB. The DC input modular power supply 180 will receive power at pins 208 and 210. The PDB is a multi-layer printed circuit (not shown) having the following conductive layers: Ground layer 214 is connected to pin 204, AC neutral layer 320 is connected to pin 206, DC return layer 316 is connected to pin 208, DC power layer 218 is connected to pin 210, first AC hot layer 222 is connected to pin 212, second AC hot layer 424 is connected to pin 430, and third AC hot layer 426 is connected to pin 432. In this embodiment, various possible DC or AC power sources may be connected to a respective modular power supply 180, e.g., correct AC voltage and/or frequency is automatically connected to the correct input pins of the power supply 180.

Referring now to FIG. 5, depicted is a plan view of a common or ground conductive layer of an exemplary power distribution board (PDB), generally represented by the numeral 500. Pin coded connectors, generally represented by the numeral 502, are located on the PDB 500 and comprise power supply common pins 504a, power supply DC power pins 710a, and power supply AC power pins 612a. The power supply common pins 504a may be used as a DC return (e.g., DC power supply ground) in combination with the DC power pins 710a for supplying DC power to a DC power supply (not shown), or as an AC neutral in combination with the AC power pins 612a for supplying AC power to an AC power supply (not shown). By utilizing the power supply common pins 504a for either the AC or DC power supplies, one conductive layer of the PDB 500 is saved. Inserting an AC power supply into a system PDB 500 connected to a DC power source will do no harm since the power pins 612a and 710a are spatially coded to the appropriate power supply. When an AC power source is connected to the PDB, there is the same result. Cutouts (slots) 530 in the PDB 500 may be used to provide required safety code spacing between the AC power (hot) (pins 612a) and the AC neutral (pins 504a). Power supply common conductive layer 514 connects the power supply common pins 504a to, for example, common pins 504b of the PDB 500 (for use with other system plug-in boards) and a common connection (not shown) to an external power source. Also shown for exemplary purposes are system ground pins 524 which are coupled to the common conductive layer 514, common pins 504a and common pins 504b through the system chassis and/or power supplies.

Referring now to FIG. 6, depicted is a plan view of an alternating current (AC) conductive layer of the exemplary PDB 500 of FIG. 5. The AC power pins 612a are connected to an AC hot (phase) connection (not shown) by an AC conductive layer 622. The AC hot (phase) connection may be coupled to an external AC power source. The AC conductive layer 622 may also couple the AC power pins 612a and the AC power source (not shown) to AC power pins 612b. The cutouts (slots) 530 in the PDB 500 may be used to provide required safety code spacing between the AC power (hot) (pins 612a) and the AC neutral (pins 504a). The common conductive layer 514 and the AC conductive layer 622 are separate conductive layers of the PDB 500.

Referring now to FIG. 7, depicted is a plan view of a direct current (DC) conductive layer of the exemplary PDB 500 of FIG. 5. The DC power pins 710a are connected to a DC power connection (not shown) by an DC conductive layer 718. The DC power connection may be coupled to an external DC power source The DC conductive layer 718 may also couple the DC power pins 710a and the DC power source (not shown) to DC power pins 710b. The common conductive layer 514, the AC conductive layer 622 and the DC conductive layer 718 are separate conductive layers of the PDB 500.

The invention, therefore, is well adapted to carry out the objects and to attain the ends and advantages mentioned, as well as others inherent therein. While the invention has been depicted, described, and is defined by reference to exemplary embodiments of the invention, such references do not imply a limitation on the invention, and no such limitation is to be inferred. The invention is capable of considerable modification, alteration, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. An apparatus having pin coded connectors for providing either an alternating current (AC) or a direct current (DC) power source to at least one power supply, comprising:
   a power distribution board (PDB) having pin coded connectors with a plurality of electrically conductive pins for providing either an alternating current (AC) or a direct current (DC) power source to at least one power supply; and
   a plurality of conductive layers in said PDB, wherein selected ones of said plurality of conductive layers connect certain ones of the plurality of electrically conductive pins of the pin coded connectors to the alternating current (AC) and the direct current (DC) power sources.

2. The information handling system according to claim 1, wherein the DC power source is approximately 48 volts DC.

3. The apparatus according to claim 1, wherein different ones of the plurality of electrically conductive pins are connected to the AC and DC power sources.

4. The apparatus according to claim 1, wherein some of the certain ones of the plurality of electrically conductive pins are connected to both of the AC and DC power sources.

5. The apparatus according to claim 1, further comprising opening in said PDB between some of the plurality of electrically conductive pins of the pin coded connectors.

6. The apparatus according to claim 1, wherein some of said plurality of conductive layers are common for either the AC or DC power sources.

7. The apparatus according to claim 1, wherein some of the connections are common for either the AC or DC power sources.

* * * * *